United States Patent [19]
Makihara

[11] Patent Number: 5,471,432
[45] Date of Patent: Nov. 28, 1995

[54] SEMICONDUCTOR MEMORY DEVICE HAVING ADDRESS TRANSITION AND SUPPLY VOLTAGE DETECTING CIRCUITS

[75] Inventor: Hiroyasu Makihara, Hyogo, Japan

[73] Assignee: Mitsubishi Denki Kabushiki Kaisha, Tokyo, Japan

[21] Appl. No.: 181,487

[22] Filed: Jan. 13, 1994

Related U.S. Application Data

[63] Continuation of Ser. No. 831,437, Feb. 5, 1992, abandoned.

[30] Foreign Application Priority Data

Feb. 12, 1991 [JP] Japan ..................................... 3-042707

[51] Int. Cl.$^6$ .................................................... G11C 8/00
[52] U.S. Cl. ......................... 365/233.5; 365/195; 365/226
[58] Field of Search .............................. 365/233.5, 201, 365/230.01, 226, 195, 196; 307/296.5

[56] References Cited

U.S. PATENT DOCUMENTS

| | | | |
|---|---|---|---|
| 4,630,239 | 12/1986 | Reed et al. ........................... | 365/226 X |
| 4,812,679 | 3/1989 | Mahabadi .............................. | 307/272.1 |
| 4,893,282 | 1/1990 | Wada et al. ........................... | 365/233.5 |
| 4,965,474 | 10/1990 | Childers et al. ....................... | 365/233.5 |
| 5,120,993 | 6/1992 | Tsay et al. ............................ | 307/296.5 |
| 5,138,575 | 8/1992 | Ema et al. ............................ | 365/233.5 |

FOREIGN PATENT DOCUMENTS

| | | |
|---|---|---|
| 59-30284 | 2/1984 | Japan . |
| 1-264691 | 10/1989 | Japan . |

OTHER PUBLICATIONS

R. Kertis, et al., "A 12-ns ECL I/O 256K×1-bit SRAM Using A 1-μn BiCMOS Technology", IEEE Journal of Solid-State Circuits, vol. 23, No. 5, Oct. 1988, pp. 1048–1053.

Primary Examiner—Joseph A. Popek
Assistant Examiner—Tan Nguyen
Attorney, Agent, or Firm—Lowe, Price, LeBlanc & Becker

[57] ABSTRACT

A ROM includes an address transition detection circuit and a supply voltage rising detection circuit. The supply voltage rising detection circuit inhibits an operation of the address transition detection circuit until a supply voltage reaches a predetermined voltage after application of power.

13 Claims, 7 Drawing Sheets

SEMICONDUCTOR MEMORY DEVICE HAVING ADDRESS TRANSITION AND SUPPLY VOLTAGE DETECTING CIRCUITS

This application is a continuation of application Ser. No. 07/831,437 filed Feb. 5, 1992, now abandoned.

BACKGROUND OF THE INVENTION

1. Field of the Invention

The invention relates to a semiconductor memory device, and particularly to a semiconductor memory device having an address transition detection circuit and a method for operating the same.

2. Description of the Prior Art

FIG. 10 is a block diagram showing a conventional mask ROM (read only memory) having an address transition detection circuit. On a semiconductor chip 1a, there are provided a memory matrix 2, an address input circuit 3, a row decoder 4, a column decoder 5, a sense circuit 6, an output circuit 7 and an address transition detection circuit 8a.

Memory matrix 2 includes a plurality of word lines, a plurality of bit lines intersecting the word lines, and a plurality of memory cells arranged at intersections of the word lines and the bit lines. FIG. 10 shows only one word line WL, one bit line BL and one memory cell MC.

Address input circuit 3 receives externally applied address signals a0–an, and applies the same to address transition detection circuit 8a. Address input circuit 3 also applies a row address signal and a column address signal to row decoder 4 and column decoder 5, respectively. Row decoder 4 is responsive to the row address signal to select any of word lines WL in memory matrix 2. Data is read from memory cells MC connected to word line WL thus selected to corresponding bit line BL.

Sense circuit 6 includes a selection circuit which is responsive to the column address signal to select any of data read to bit lines BL, a precharging circuit which precharges bit lines BL in memory matrix 2, a sense amplifier circuit which senses and amplifies the data, and a latch circuit which holds the output data. Output circuit 7 externally outputs the data applied from sense circuit 6 as output data $D_{out}$.

Address transition detection circuit 8a detects the transition of address signal to generate an address transition detection signal ATD in a pulse form. In response to detection signal ATD, sense circuit 6 precharges bit line BL, performs sensing and amplifying of data, and holds the output data.

In this manner, sense circuit 6 is controlled in response to detection signal ATD applied from address transition detection circuit 8a.

As shown in FIG. 11, however, if address transition detection circuit 8a generates detection signal ATD in the pulse form immediately after the application of power, and particularly before supply voltage Vcc reaches a predetermined voltage V1 which allows a stable operation of sense circuit 6, sense circuit 6 malfunctions. In order to prevent the malfunction, a dummy cycle must be provided in the address signal by setting a chip enable signal $\overline{CE}$ at an inactive state (high level) immediately after the application of power.

SUMMARY OF THE INVENTION

It is an object of the invention to provide a semiconductor memory device having an address transition detection circuit capable of preventing malfunction which may be caused immediately after application of power.

It is another object of the invention to achieve a stable operation of a semiconductor memory device without providing a dummy cycle immediately after application of power.

It is still another object of the invention to provide a semiconductor memory device capable of preventing malfunction of an address transition detection circuit, which may be caused immediately after the application of power, and to provide an operation method for the same.

A semiconductor memory device according to the invention includes a detection circuit for detecting transition of an address signal and generating a predetermined detection signal, a memory device which operates in response to the address signal and the detection signal for storing data, an inhibiting circuit for inhibiting an operation of the detection circuit data until the supply voltage goes to a predetermined voltage immediately after application of power.

In the semiconductor memory device, the inhibiting circuit inhibits the operation of the detection circuit until the supply voltage goes to the predetermined voltage, which allows a stable operation of the memory device, immediately after the application of the power. Thereby, the operation of the memory device is inhibited until the power supply voltage reaches the predetermined voltage. Consequently, the stable operation of the memory device can be ensured immediately after the application of power without a dummy cycle.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
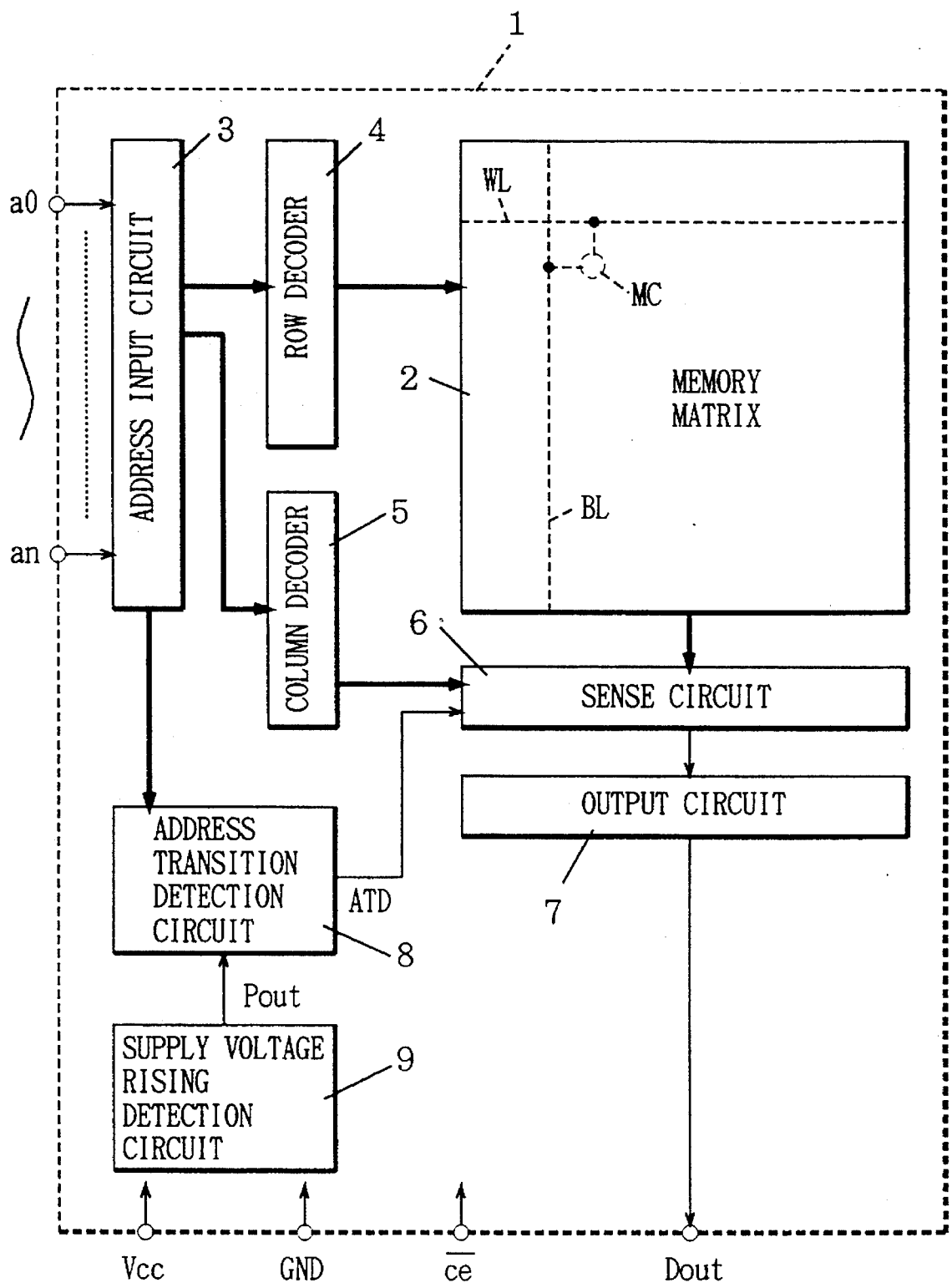
FIG. 1 is a block diagram showing a construction of a mask ROM according to an embodiment of the invention.

With reference to FIG. 1 showing a mask ROM according to an embodiment of the invention, there are provided, on a semiconductor chip 1, a memory matrix 2, an address input circuit 3, a row decoder 4, a column decoder 5, a sense circuit 6, an output circuit 7, an address transition detection circuit 8 and a supply voltage rising detection circuit 9. The ROM in FIG. 1 differs from the ROM in FIG. 10 in that it includes an address transition detection circuit 8 of which construction and operation are different from those of address transition detection circuit 8a and that it further includes a supply voltage rising detection circuit 9.

Figure 10:
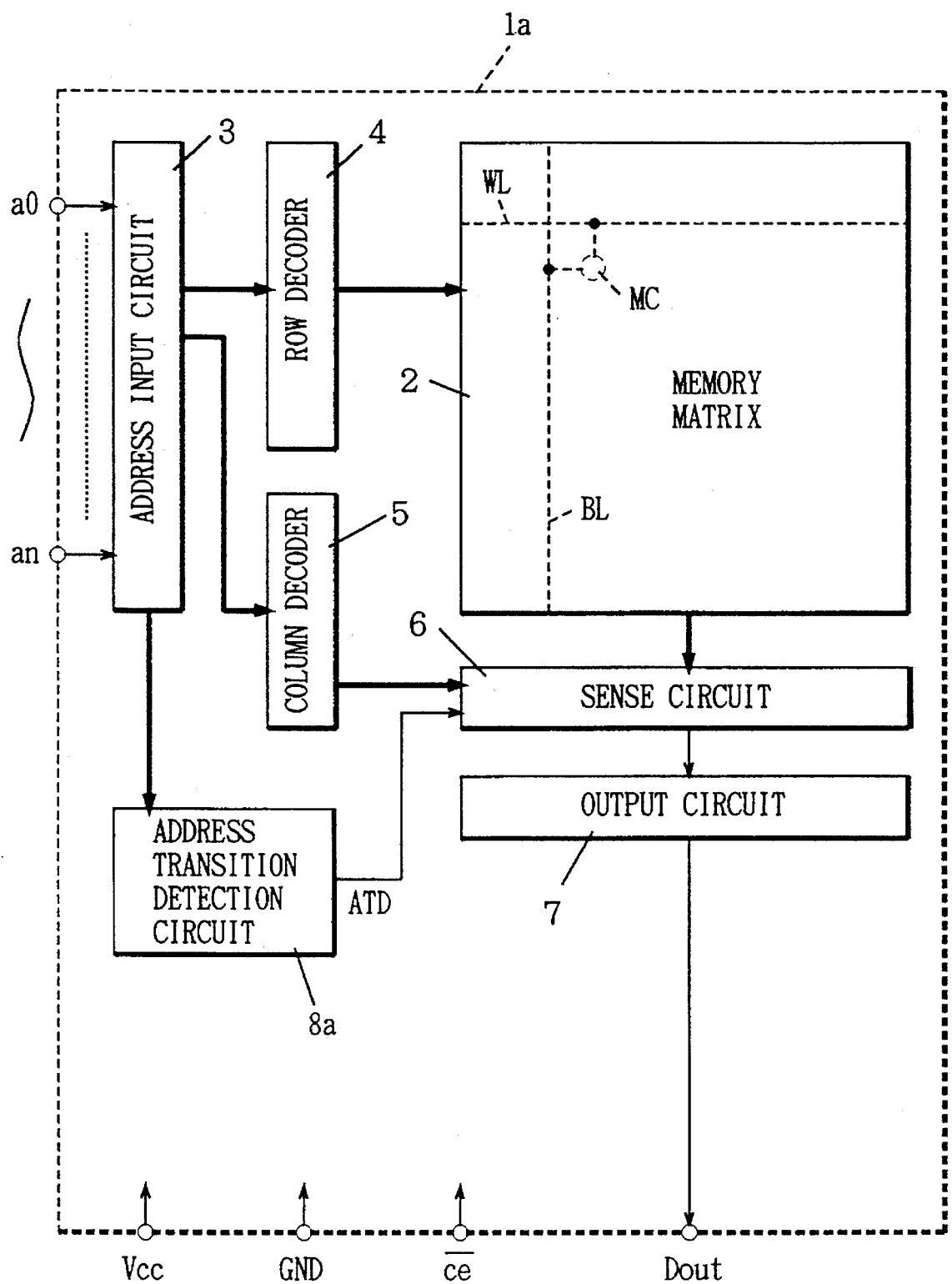
FIG. 10 is a block diagram showing a construction of a conventional mask ROM.
Figure 11:
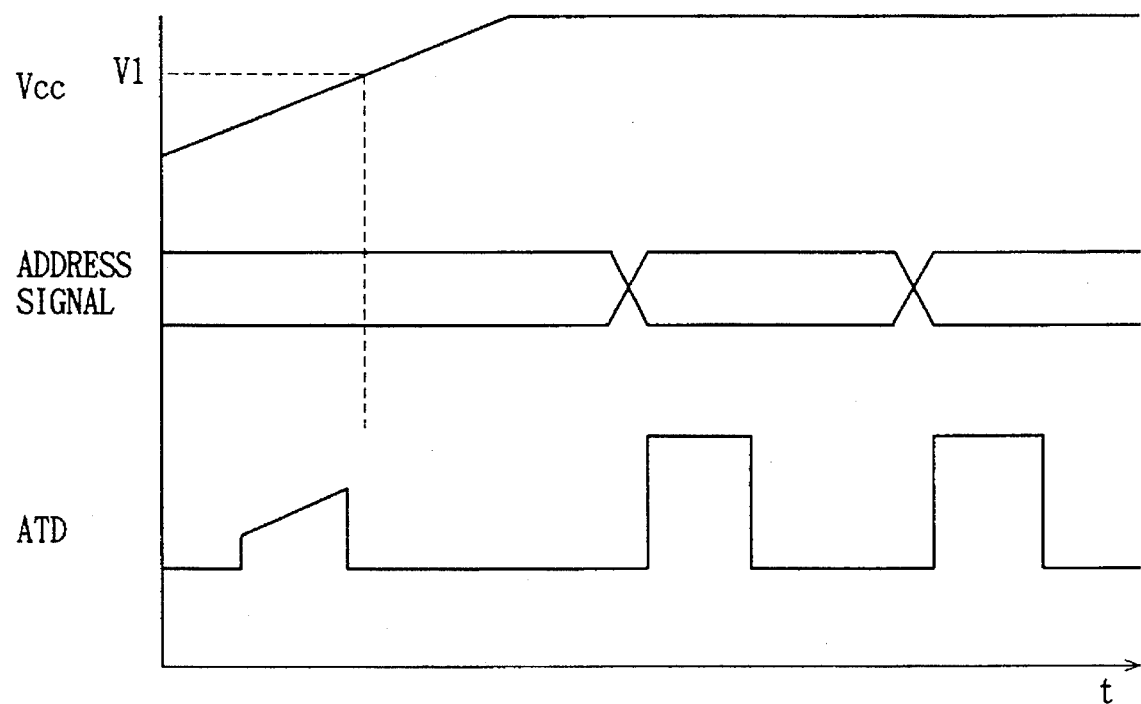
FIG. 11 is a signal waveform diagram showing an operation of a conventional mask ROM.

Other constructions and operations are similar to those of the corresponding portions and parts shown in FIG. 10.

Figure 2:
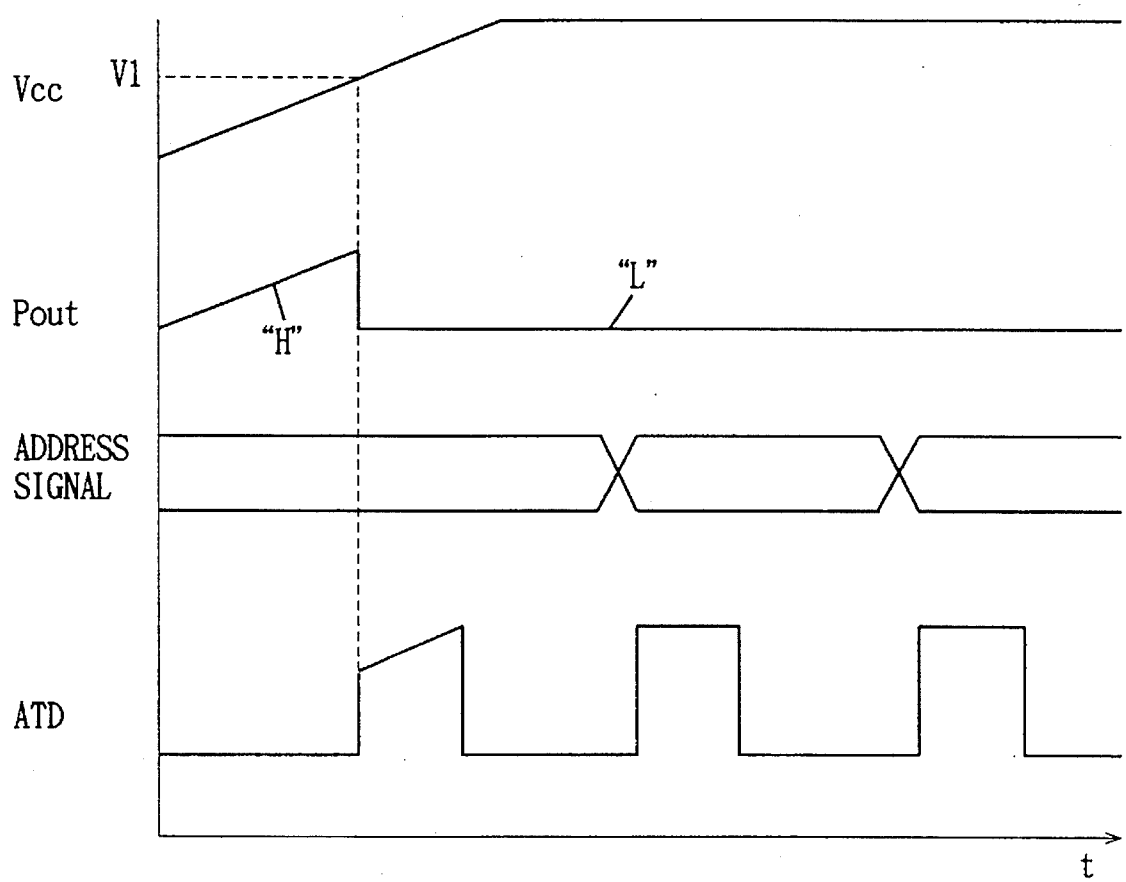
FIG. 2 is a signal waveform diagram for showing an operation of a mask ROM in FIG. 1.

With reference to FIG. 2, operations of address transition detection circuit 8 and supply voltage rising detection circuit 9 shown in FIG. 1 will be described below. Immediately after application of power, an output signal $P_{out}$ of supply voltage rising detection circuit 9 gradually rises in accordance with rising of supply voltage Vcc. During this operation, output signal $P_{out}$ is in a logically high level ("H"). Output signal $P_{out}$ in the high level is applied as an operation inhibiting signal to address transition detection circuit 8. Thereby, address transition detection circuit 8 is set at an inactive state.

When supply voltage Vcc reaches a predetermined voltage V1, output signal $P_{out}$ of supply voltage rising detection circuit 9 lowers to a logically low level ("L"). Predetermined voltage V1 is a voltage allowing a correct operation of sense circuit 6.

When output signal $P_{out}$ is in the low level, address transition detection circuit 8 is activated. Thereby, address transition detection circuit 8 generates address transition detection signal ATD in the pulse form in response to the address signal supplied from address input circuit 3. Sense circuit 6 is controlled in response to address transition detection signal ATD.

In the embodiment described above, output signal $P_{out}$ of supply voltage rising detection circuit 9 inhibits the operation of address transition detection circuit 8, until supply voltage Vcc reaches the predetermined value of V1. Accordingly, malfunction of sense circuit 6 in the rising operation of power supply voltage Vcc is prevented without providing the dummy cycle in the address signal.

Figure 3:
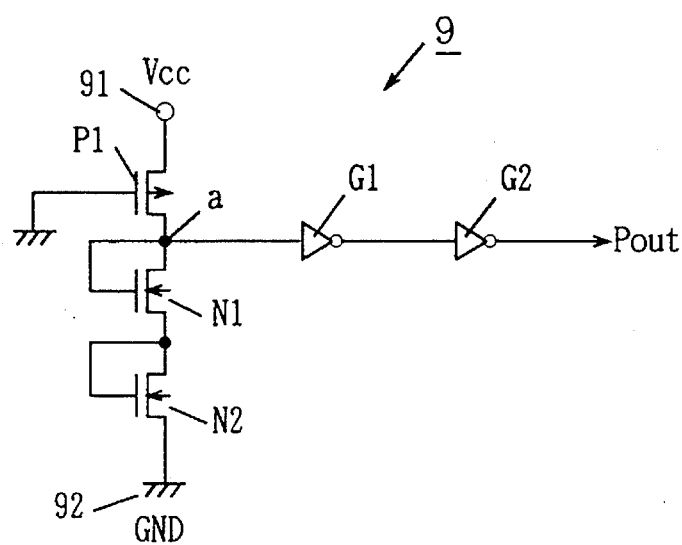
FIG. 3 is a circuit diagram showing a construction of a supply voltage rising detection circuit.

FIG. 3 shows a specific construction of a power supply voltage rising detection circuit 9. Supply voltage rising detection circuit 9 includes a P-channel MOS transistor P1, N-channel MOS transistors N1 and N2, and inverters G1 and G2. Transistor P1 is connected between a power supply terminal 91 for receiving supply voltage Vcc and a node a. Transistors N1 and N2 are connected in series between node a and a power supply terminal 92 receiving a ground voltage GND. Transistors N1 and N2 are diode-connected together. Inverters G1 and G2 are connected to node a in series. Inverter G2 has an output terminal for supplying output signal $P_{out}$.

Figure 4:
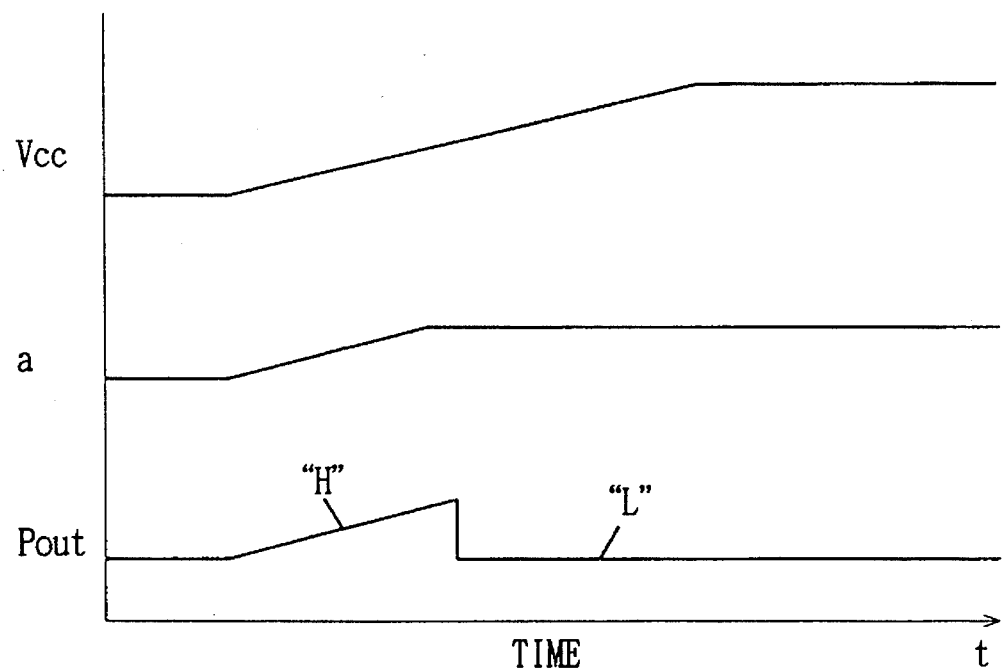
FIG. 4 is a voltage waveform diagram showing an operation of a supply voltage rising detection circuit.

With reference to a voltage waveform diagram of FIG. 4, an operation of supply voltage rising detection circuit 9 in FIG. 3 will be described below. When supply voltage Vcc starts to rise, a potential of node a rises in accordance with the rising of supply voltage Vcc owing to transistor P1 which is always turned on. During this operation, the voltage of output signal $P_{out}$ rises similarly to the potential of node a.

When the potential of node a exceeds a threshold voltage of transistors N1 and N2, transistors N1 and N2 start to be turned on. Consequently, the potential of node a has a constant voltage without following the rising of supply voltage Vcc. When the potential of node a exceeds the threshold voltage of inverter G1 relative to supply voltage Vcc, output signal $P_{out}$ changes to the low level.

Figure 5:
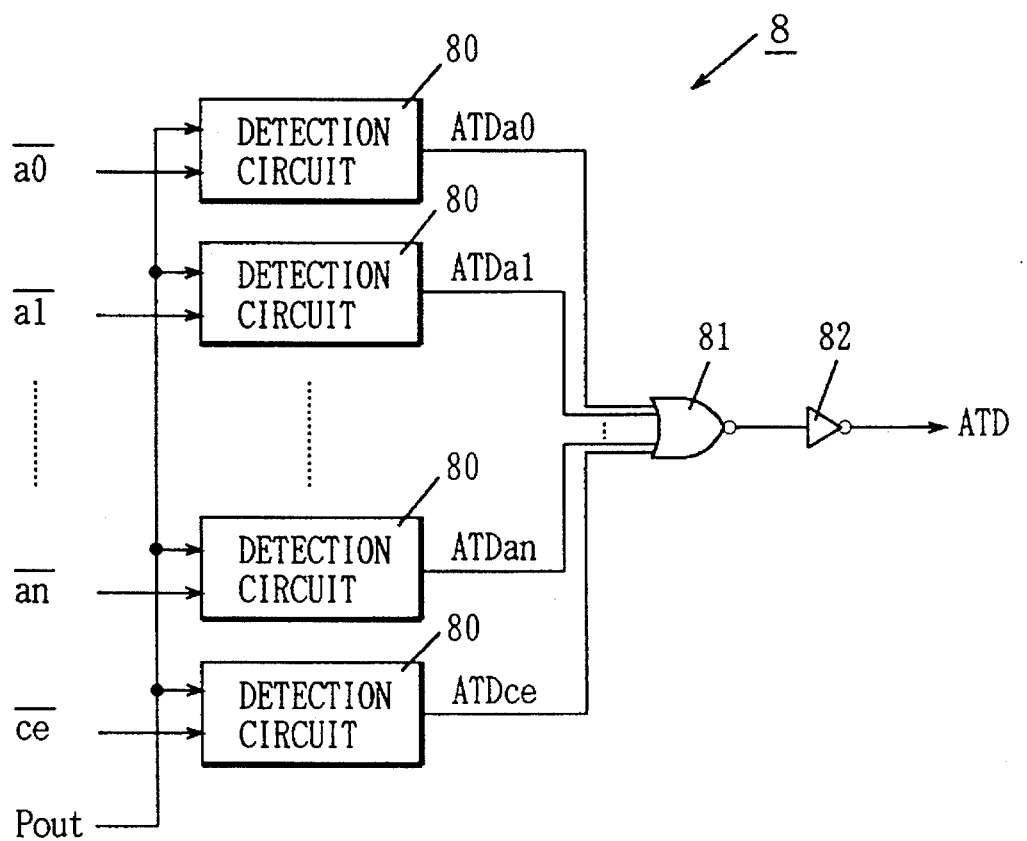
FIG. 5 shows a construction of an address transition detection circuit.

FIG. 5 shows a specific construction of address transition detection circuit 8. Address transition detection circuit 8 includes a plurality of detection circuits 80, which correspond to inverted signals $\overline{a0}$–$\overline{an}$ of address signals a0–an and a chip enable signal $\overline{ce}$, respectively. Address transition detection circuit 8 also includes an NOR gate 81 and an inverter 82. Detection circuits 80 receive inverted address signal $\overline{a0}$–$\overline{an}$ and chip enable signal $\overline{ce}$, and supply detection signals ATDa0–ATDan and a detection signal ATDce to input terminals of NOR gate 81, respectively. An output of NOR gate 81 is applied to input terminal of inverter 82. Inverter 82 supplies address transition detection signal ATD from its output terminal.

Figure 6:
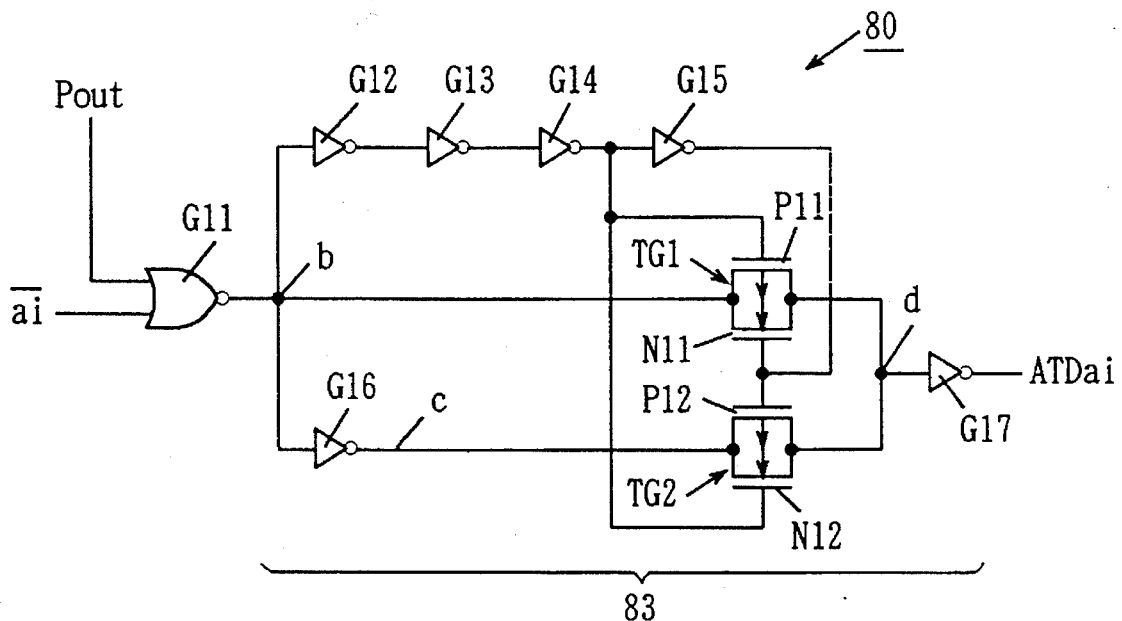
FIG. 6 is a circuit diagram showing a construction of one of detection circuits included in an address transition detection circuit.

FIG. 6 shows a specific construction of detection circuit 80. Detection circuit 80 includes an NOR gate G11 and a pulse generating circuit 83. Pulse generating circuit 83 includes inverters G12–G17, P-channel MOS transistors P11 and P12, and N-channel MOS transistors N11 and N12. Transistors P11 and N11 form a transfer gate TG1, and transistors P12 and N12 form a transfer gate TG2.

NOR gate G11 has one input terminal for receiving address signal $\overline{ai}$, wherein "i" indicates an integer among 0–n, and also includes the other input terminal for receiving output signal $P_{out}$. An output of NOR gate G11 is supplied to a node b. Node b is connected through inverters G12–G14 to a gate of transistor P11 and a gate of transistor N12. Inverter G14 has an output terminal which is connected through an inverter G15 to a gate of transistor N11 and a gate of transistor P12. Node b is also connected to transfer gate TG1, and is further connected through an inverter G16 to transfer gate TG2. Transfer gates TG1 and TG2 are connected to a node d, which is connected to an input terminal of an inverter G17. Inverter G17 supplies detection signal ATDai from its output terminal.

Figure 7:
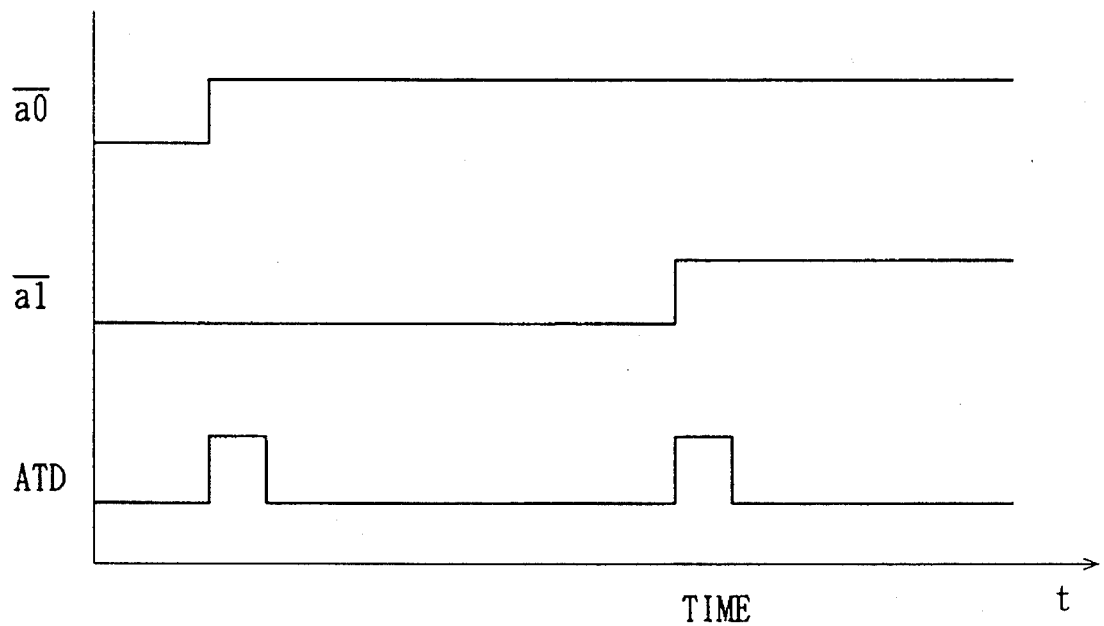
FIG. 7 is a signal waveform diagram showing an operation of an address transition detection circuit in a normal state.
Figure 8:
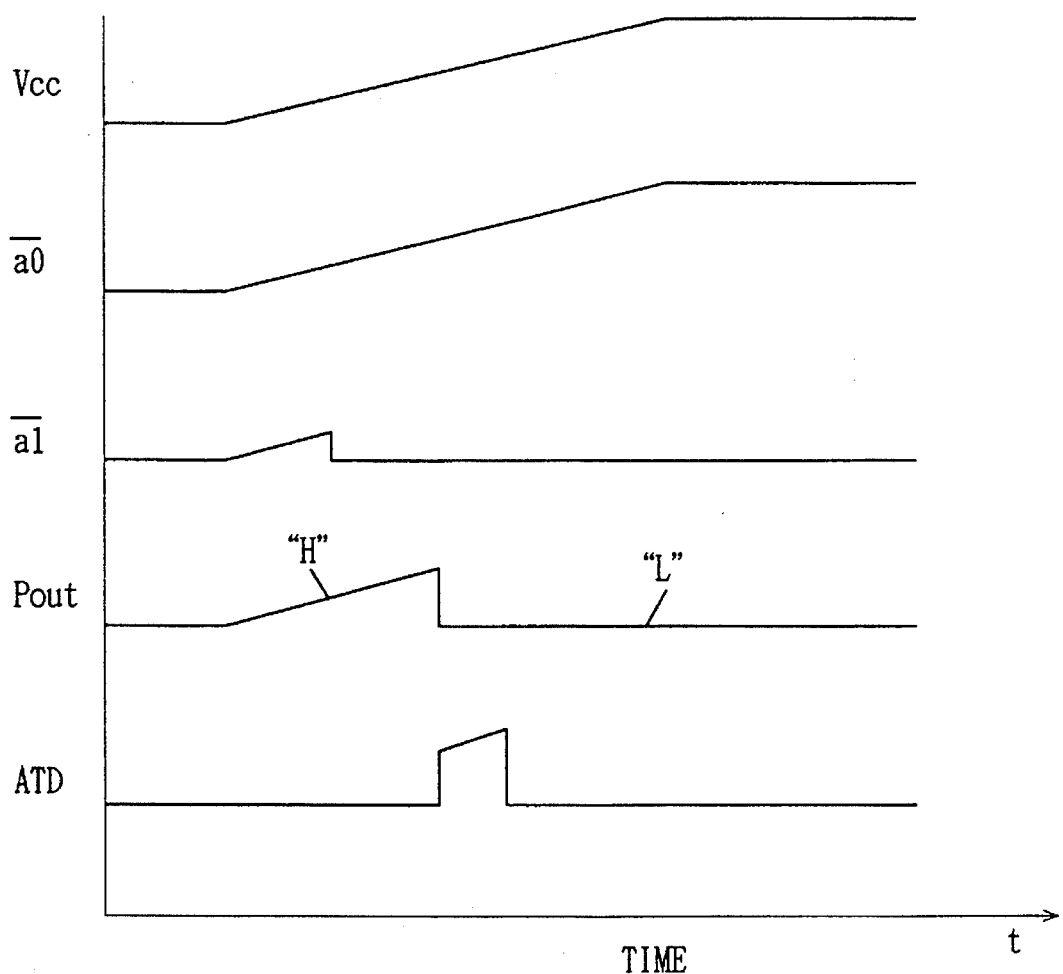
FIG. 8 is a signal waveform diagram showing an operation of an address transition detection circuit immediately after application of power.

With reference to signal waveform diagrams of FIGS. 7 and 8, an operation of address transition detection circuit 8 shown in FIGS. 5 and 6 will be described below. FIGS. 7 and 8 show only address signals $\overline{a0}$ and $\overline{a1}$.

In a normal state, when any of address signals $\overline{a0}$–$\overline{a1}$ or chip enable signal $\overline{ce}$ changes, as shown in FIG. 7, a pulse signal generates in detection signal ATD.

Immediately after the application of power, supply voltage Vcc gradually increases as shown in FIG. 8. Initially, the potential of node b is "L" owing to output signal $P_{out}$ of "H". Thereby, transfer gate TG1 is turned off, and transfer gate TG2 is turned on. Consequently, detection signal ATDai is "L".

When output signal $P_{out}$ changes to "L", the inverted signal of address signal $\overline{ai}$ is supplied to node b. If address signal $\overline{ai}$ is "L", the potential of node b changes from "L" to "H". Thereby, detection signal ATDai rises to "H". Thereafter, transfer gate TG1 is turned on, and transfer gate TG2 is turned off. Consequently, detection signal ATDai changes to "L". In this manner, a predetermined pulse generates in detection signal ATDai.

By virtue of NOR gate 81 and inverter 82 shown in FIG. 5, if at least one of address signals $\overline{a0}$–/$\overline{an}$ and chip enable signal $\overline{ce}$ is "L", the predetermined pulse generates in detection signal ATD.

In the embodiments described above, the operation of only address transition detection circuit 8 is inhibited by power supply voltage rising detection circuit 9 immediately after the application of power. However, the operation of address input circuit 3 may be additionally inhibited immediately after the application of power. In this case, an effect similar to that of the embodiments described before can be obtained.

Figure 9:
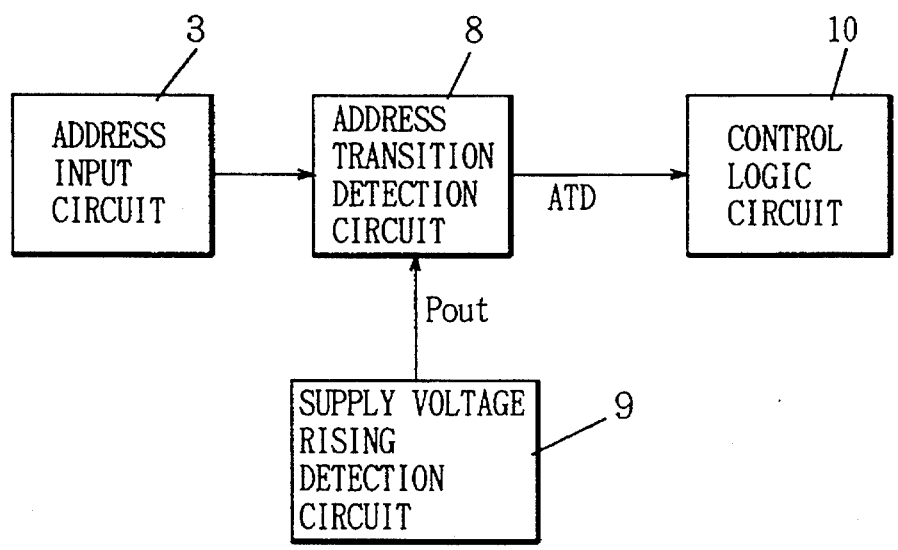
FIG. 9 is a block diagram showing another example to which the invention is applied.

In the embodiments described above, sense circuit 6 is controlled by address transition detection signal ATD supplied from address transition detection circuit 8. However, address transition detection signal ATD may control a component or device other than sense circuit 6. As shown in FIG. 9, another control logic circuit 10 may be controlled by address transition detection signal ATD supplied from address transition detection circuit 8.

The invention may be applied to semiconductor memory devices having address transition detection circuits other than mask ROMs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device driven by a supply voltage comprising:

detecting means for detecting transition of an address signal to generate a detection signal;

read only memory means which operates in response to said address signal and said detection signal for reading out data; and inhibiting means for inhibiting an operation of said detecting means until the supply voltage reaches a predetermined voltage after application of power such that said detection signal is generated only after the supply voltage has reached the predetermined voltage.

2. A semiconductor memory device according to claim 1, wherein said inhibiting means supplies an output signal, which is in a first logical level until said supply voltage reaches said predetermined voltage and is in a second logical level after said power supply voltage reaches said predetermined voltage; and said detecting means is inactivated in response to said output signal in said first logical level and is activated in response to said output signal in said second logical level.

3. A semiconductor memory device according to claim 2, wherein said inhibiting means includes:

a first power supply terminal for receiving said supply voltage;

a second power supply terminal for receiving a ground voltage;

a node;

a first field effect element which is connected between said first power supply terminal and said node and is always turned on;

a second field effect element which is diode-connected between said second power supply terminal and said node; and inverting means, coupled to said node, for inverting a signal at said node to supply said output signal to said detecting means.

4. A semiconductor memory device according to claim 3, wherein said first field effect element includes a P-channel MOS transistor, and said second field effect elements include an N-channel MOS transistor.

5. A semiconductor memory device according to claim 2, wherein said address signal includes a plurality of bits;

said detecting means includes, a plurality of pulse generating means provided correspondingly to said plurality of bits of said address signal, each generating a pulse signal in response to transition of the corresponding bit of said address signal, and logic gate means receiving output signals from said plurality of pulse generating means for generating said detection signal when any of said plurality of pulse generating means applies said pulse signal; and said plurality of pulse generating means being inactivated in response to said output signal in said first logical level supplied from said inhibiting means.

6. A semiconductor memory device according to claim 5, wherein each of said pulse generating means includes:

first logic means receiving a corresponding bit of said address signal and said output signal supplied from said inhibiting means for supplying a first output signal of a predetermined logical level when said output signal is in said first logical level and supplying a second output signal, depending on said corresponding bit of said address signal when said output signal is in said second logical level; and second logic means for supplying a pulse signal in response to a change by said first logic means from supplying said first output signal to said second output signal.

7. A semiconductor memory device according to claim 1, wherein said memory means includes:

memory matrix including a plurality of memory cells for storing data;

selecting means which is responsive to said address signal for selecting any of said plurality of memory cells in said memory matrix;

address input means for receiving an externally applied address signal and applying the same to said detecting means and said selecting means; and sense means responsive to said detection signal for sensing and amplifying data read from said memory cell selected by said selecting means.

8. A semiconductor memory device according to claim 7, wherein said memory means includes a read only memory.

9. A method for operating a semiconductor memory device driven by a supply voltage comprising the steps of:

detecting transition of an address signal and generating a detection signal;

reading out data stored in read only memory means in response to said address signal and said detection signal;

generating an inhibiting signal until said supply voltage reaches a predetermined voltage after application of power; and inhibiting generation of said detection signal in response to said inhibiting signal such that said detection signal is generated only after the supply voltage has reached the predetermined voltage.

10. An address transition detecting device for detecting transition of an address signal including:

detecting means for detecting the transition of said address signal and generating a detection signal to read out data stored in a read only memory means; and inhibiting means for inhibiting an operation of said detecting means until a supply voltage reaches a predetermined voltage after application of power such that said detection signal is generated only after the supply voltage has reached the predetermined voltage.

11. An address transition detecting method comprising the steps of:

detecting transition of an address signal and generating a detection signal for reading out data stored in a read only memory means; and inhibiting generation of said detection signal until a power supply voltage reaches a predetermined voltage after application of power such that said detection signal is generated only after the supply voltage has reached the predetermined voltage.

12. A semiconductor memory device driven by a power supply voltage comprising:

a) detecting means for detecting transition of an address signal to generate a detection signal;

b) read only memory means which operates in response to said address signal and said detection signal for reading out data; and c) inhibiting means for inhibiting an operation of said detection means until the power supply voltage reaches a predetermined voltage after application of power such that said detection signal is generated only after the supply voltage has reached the predetermined voltage, wherein said inhibiting includes i) a first power supply terminal for receiving said supply voltage, ii) a second power supply terminal for receiving a ground voltage, iii) a node, iv) a first field effect element which is connected between said first power supply terminal and said node and is always turned on, v) a second field effect element which is diode-connected between said second power supply terminal and said node, and vi) inverting means, coupled to said node, for inverting a signal at said node to supply said output signal to said detecting means.

13. An addressable semiconductor memory device driven by a supply voltage sourse and responsive to address signals for storing data, comprising:

first means for detecting a transition of an address signal;

second means for detecting that the supply voltage source has attained a prescribed voltage level following turning on of the source;

a read only memory for storing data at a location prescribed by the address signal; and third means for reading out said data in said memory in accordance with outputs of said first and second means, such that said data is read out from said memory upon an address signal transition only after the supply voltage source has attained said prescribed voltage level.

* * * * *